United States Patent
Balanescu et al.

(10) Patent No.: US 11,316,731 B2
(45) Date of Patent: Apr. 26, 2022

(54) DETERMINE VALID DROP TARGETS FOR NODES FROM MAPPING

(71) Applicant: International Business Machines Corporation, Armonk, NY (US)

(72) Inventors: Vlad Balanescu, Stanmore (GB); Doina Liliana Klinger, Winchester (GB); Ashley Donald Harrison, Southampton (GB)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 16/449,869

(22) Filed: Jun. 24, 2019

(65) Prior Publication Data
US 2020/0403859 A1 Dec. 24, 2020

(51) Int. Cl.
| | |
|---|---|
| H04L 41/0806 | (2022.01) |
| G06F 16/16 | (2019.01) |
| H04L 41/12 | (2022.01) |
| H04L 41/0816 | (2022.01) |
| G06F 3/0486 | (2013.01) |

(52) U.S. Cl.
CPC ........ *H04L 41/0806* (2013.01); *G06F 3/0486* (2013.01); *G06F 16/168* (2019.01); *H04L 41/0816* (2013.01); *H04L 41/12* (2013.01)

(58) Field of Classification Search
USPC ........................................................ 709/221
See application file for complete search history.

(56) References Cited

U.S. PATENT DOCUMENTS

| | | | |
|---|---|---|---|
| 7,665,028 B2 | 2/2010 | Cummins et al. | |
| 8,239,781 B2 | 8/2012 | Taylor | |
| 2004/0230583 A1* | 11/2004 | Testa | H04L 45/7457 |
| 2005/0138057 A1* | 6/2005 | Bender | G06F 9/451 |
| | | | 707/999.102 |
| 2007/0162489 A1* | 7/2007 | Hobbs | G06F 16/907 |
| | | | 707/999.102 |
| 2008/0065679 A1 | 3/2008 | Fish et al. | |
| 2009/0249239 A1* | 10/2009 | Eilers | G06F 3/0486 |
| | | | 715/769 |
| 2011/0209149 A1* | 8/2011 | Simitsis | G06Q 10/06 |
| | | | 718/100 |

(Continued)

OTHER PUBLICATIONS

Mell et al., "The NIST Definition of Cloud Computing," Recommendations of the National Institute of Standards and Technology, U.S. Department of Commerce, Special Publication 800-145, Sep. 2011, 7 pages.

(Continued)

*Primary Examiner* — Hermon Asres
(74) *Attorney, Agent, or Firm* — Rachel M. Yadlosky (57) ABSTRACT

A method, system, and computer program product for determining valid drop targets for nodes within an integration flow using mapping that includes: identifying a first node, identifying one or more input nodes, where the one or more input nodes are nodes within an integration flow of the first node, analyzing a mapping of the first node, where the analyzing includes determining whether the mapping contains one or more inputs from the one or more input nodes, and in response to determining that the mapping contains one or more inputs from an input node of the one or more input nodes, identifying valid drop points for the first node using the input node.

19 Claims, 8 Drawing Sheets

(56) References Cited

U.S. PATENT DOCUMENTS

| | | |
|---|---|---|
| 2012/0167094 A1 | 6/2012 | Suit |
| 2014/0280363 A1* | 9/2014 | Heng .................... G06F 16/185 707/802 |
| 2016/0291942 A1 | 10/2016 | Hutchison |
| 2016/0359689 A1 | 12/2016 | Herreria et al. |

OTHER PUBLICATIONS

Oracle, "Fusion Middleware Web User Interface Developer's Guide for Oracle Application Development Framework," Printed Jan. 16, 2019, 44 pages https://docs.oracle.com/cd/E28280_01/web.1111/b31973/af_dnd.htm#ADFUI740.

Microsoft, "Validate code with dependency diagrams," Visual Studio Docs, Nov. 3, 2016, 8 pages https://docs.microsoft.com/en-us/visualstudio/modeling/validate-code-with-layer-diagrams?view=vs-2017.

Klinger et al., "Determining Inputs to an Integration Flow Component," U.S. Appl. No. 15/915,443, filed Mar. 8, 2018.

* cited by examiner

DETERMINE VALID DROP TARGETS FOR NODES FROM MAPPING

BACKGROUND

The present disclosure relates to integration flows, and more specifically to determining valid drop targets for nodes within the integration flow using mapping.

SUMMARY

The present invention provides a computer-implemented method, system, and computer program product to determine valid drop targets for nodes within the integration flow using mapping. The method may include identifying a first node. The method may also include identifying one or more input nodes, where the one or more input nodes are nodes within an integration flow of the first node. The method may also include analyzing a mapping of the first node, where the analyzing includes determining whether the mapping contains one or more inputs from the one or more input nodes. The method may also include, in response to determining that the mapping contains one or more inputs from an input node of the one or more input nodes, identifying valid drop points for the first node using the input node.

The system may have one or more computer processors and may be configured to identify a first node. The system may also be configured to identify one or more input nodes, where the one or more input nodes are nodes within an integration flow of the first node. The system may also be configured to analyze a mapping of the first node, where the analyzing includes determining whether the mapping contains one or more inputs from the one or more input nodes. The system may also be configured to, in response to determining that the mapping contains one or more inputs from an input node of the one or more input nodes, identify valid drop points for the first node using the input node.

The computer program product may include a computer readable storage medium having program instructions embodied therewith, the program instructions executable by a server to cause the server to perform a method. The method may include identifying a first node. The method may also include identifying one or more input nodes, where the one or more input nodes are nodes within an integration flow of the first node. The method may also include analyzing a mapping of the first node, where the analyzing includes determining whether the mapping contains one or more inputs from the one or more input nodes. The method may also include, in response to determining that the mapping contains one or more inputs from an input node of the one or more input nodes, identifying valid drop points for the first node using the input node.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to integration flows, and more specifically to determining valid drop targets for nodes within the integration flow using mapping. While the present disclosure is not necessarily limited to such applications, various aspects of the disclosure may be appreciated through a discussion of various examples using this context.

Through integration, various software applications, or components, may be linked in order to establish a connectivity between the different applications/components and combine them into an executable whole. An integration may be enabled through an integration process flow (referred to herein as an integration flow), which includes a sequence of nodes (i.e., components) that are combined to form the integration flow. Each node may have inputs and outputs that define an interaction (or interactions) with an object that is exposed by an external application. These inputs and outputs are defined in an input array and output array, respectively, for the node, and the arrays may be included in a mapping for the node. A mapping defines how to calculate, or set, values as its parameters, which are used to interact with external applications or external systems.

Integrations may be developed using tools such as integration templates and a rich graphical editing experience. Using these tools, a user may be able to organize, and re-organize, the integration flow and the locations of each component, or node, in the flow. For example, a user may be able to change the location, or move, a component using a drag and drop mechanism.

In an integration programming model, such as a programming model developed using the integration templates and a rich graphical editing experience, a component can take, as inputs, the outputs of the nodes that are before a current node in a given execution branch of an integration flow, or in an execution branch prior to the given execution branch. A node can use any of the fields of the input objects (i.e., mapping sources) that are in its scope, and use those fields in its configuration. Each of the nodes is configured with a set of mappings, as discussed herein. In order to build an integration flow, a user may use the rich graphical editing experience, and possibly an integration template (e.g., with a palette that a user can use to add nodes to the integration flow). Once a node has been added and configured (e.g., with mapping sources that have been computed by the computer system), a user may decide that the node is in the wrong position in the integration flow, and may decide to move the node (e.g., using a drag and drop operation). Because input sources are different for each node depending on its position in the integration flow, only certain drop targets are valid in order to maintain the validity of any current mappings on the node. Current integration flow programs, and rich graphical editing experiences, may not consider maintaining the validity of current mappings on the node when displaying drop targets (i.e., locations to move the current node to).

The present disclosure provides a computer-implemented method, system, and computer program product for determining valid drop targets for nodes within the integration flow using mapping. When a node has been selected for moving (e.g., when a user starts a drag operation), the system may analyze mappings of the node being dragged and a structure of the integration flow. The system may have knowledge of all potential drop points for a new node and, using the mappings of the node being dragged, may determine valid drop points for the current node.

Figure 1:
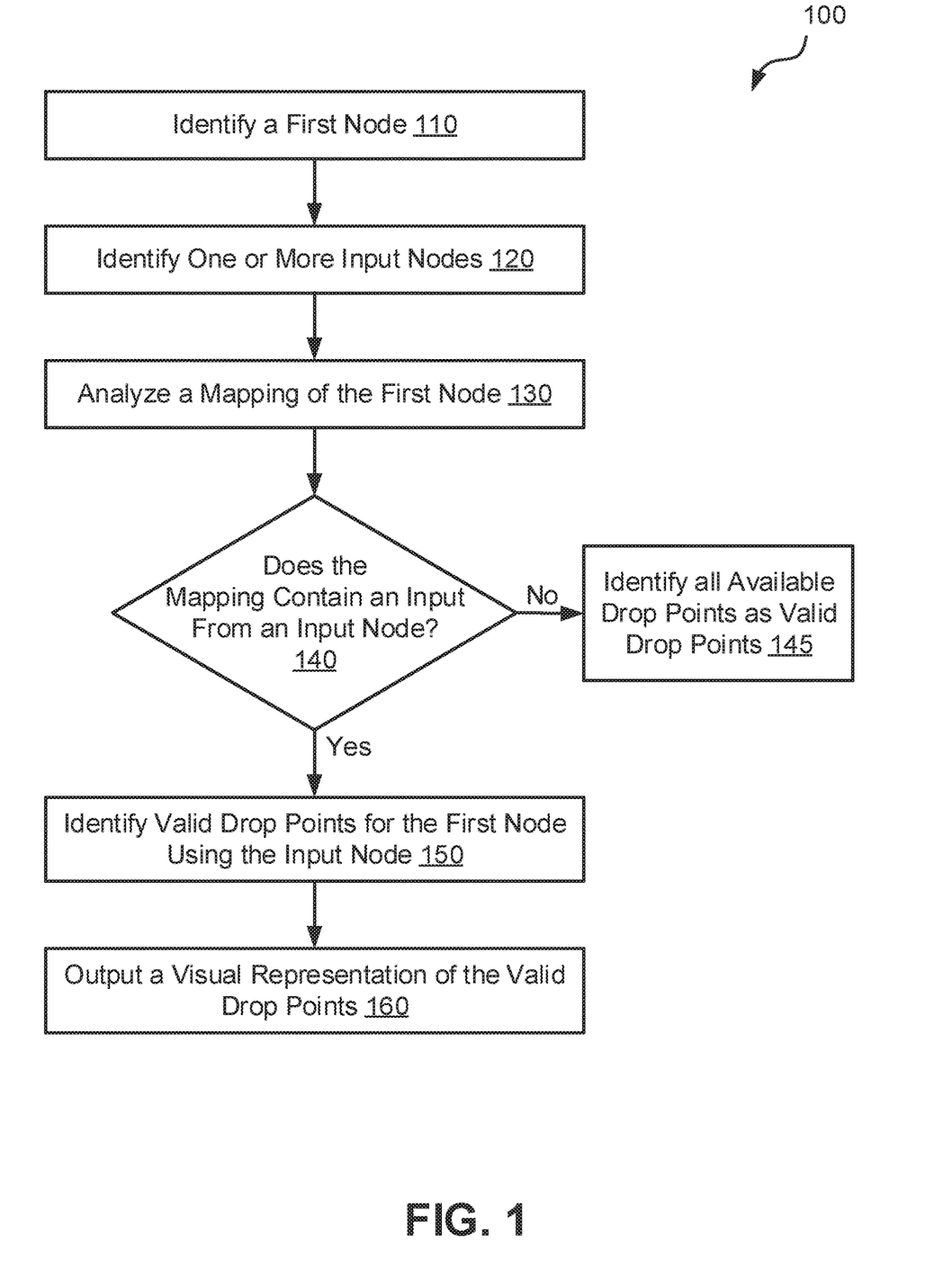
FIG. 1 depicts a flowchart of a set of operations for determining valid drop targets, according to some embodiments.
Figure 6:
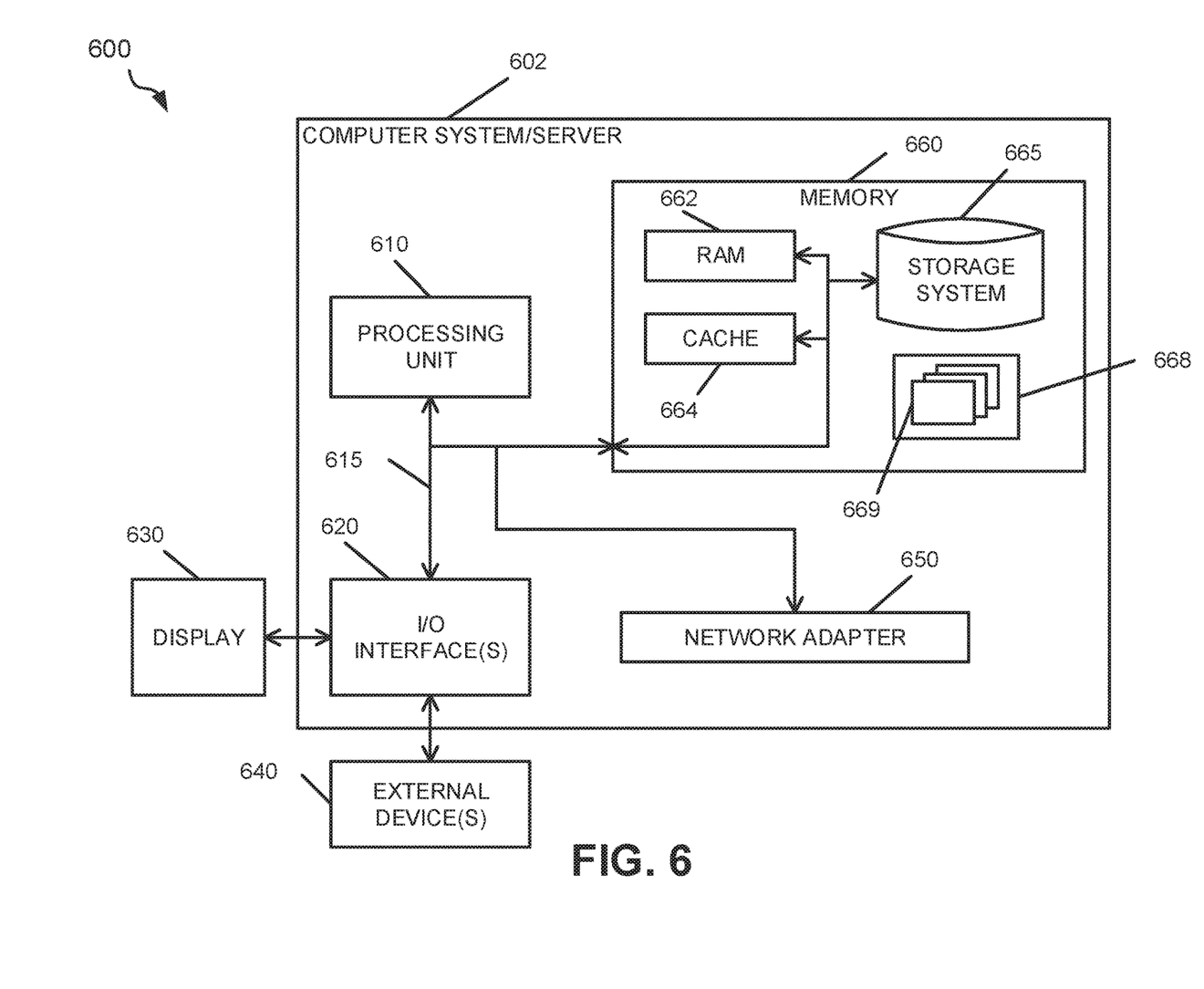
FIG. 6 depicts a block diagram of a sample computer system, according to some embodiments.

Referring now to FIG. 1, a flowchart illustrating a method 100 for determining valid drop targets is depicted, according to some embodiments. In some embodiments, the method 100 is implemented as a computer script or computer program (e.g., computer executable code) to be executed by a server on or connected to a computer system (e.g., computer system 600 (FIG. 6)). In some embodiments, the server is a computer device, such as computer system/server 602 (FIG. 6). In some embodiments, the method 100 is executed on a cloud computing environment (e.g., cloud computing environment 50 (FIG. 7)).

In some embodiments, method 100 includes executing operation 110 to identify a first node. The first node may be a component in an integration flow. The first node, in some embodiments, is a node that has been selected to move or change positions in the integration flow. In some embodiments, the first node is selected by a user for moving. The first node may be moved using a drag and drop operation. For example, a user may click on a node using a mouse, in order to start a drag and drop operation. The selected node (e.g., via mouse click, touch pad, touch screen, etc.) may be the first node.

In some embodiments, method 100 includes executing operation 120 to identify one or more input nodes. The input nodes may be nodes that are within the same integration flow as the first node, for example upstream from the first node. Identifying one or more input nodes (operation 120) is discussed further herein, and is further depicted in FIG. 2.

In some embodiments, method 100 includes executing operation 130 to analyze a mapping of the first node. Each node may be configured with a set of mappings, which are a way of setting values to the node's parameters. These mappings include, or are configured with, input values that are mapped from input nodes. Mappings for a particular node could use values from any input nodes as input values, but typically use values from a subset of the input nodes. The mapping of the first node may be analyzed to determine which input nodes, or which subset of input nodes, are included in the mapping. In other words, analyzing the mapping of the first node may include determining whether the mapping contains one or more inputs from the one or more input nodes.

In some embodiments, method 100 includes executing operation 140 to determine whether the mapping contains an input from an input node. As discussed above, the mapping of the first node may be analyzed to determine which input nodes are included in the mapping. This determination may occur in operation 140. In some embodiments, determining whether the mapping contains an input from an input node is done by looping through, or checking, each node in the integration flow until a node is found with a corresponding input in the first node's mapping. The looping, or checking, may be executed starting with the input node closest to the first node (referred to herein as the nearest input node). For example, if the first node has a preceding node within the same execution branch, the preceding node is the nearest input node. In another example, if there is no preceding node within the same execution branch, then the parent node (i.e., the preceding node from which the first node branches off from) is the nearest input node. Performing the determination starting with the input node closest to the first node (the nearest input node) may increase the efficiency of the determination because not every node may have to be checked. Once an input node is determined, the other input nodes may not need to be checked.

In some embodiments, the determination is executed in any order, but all input nodes are checked to determine whether the corresponding input is contained in the mapping (regardless of if an input node is found to have a corresponding input that is contained in the mapping). In this embodiment, once each input node has been checked, the input nodes with corresponding inputs contained in the mappings are analyzed in order to determine which of the input nodes are closest to the first node (i.e., the nearest input node). This method of determination may increase the accuracy of the determination, because each input is checked.

Figure 3:
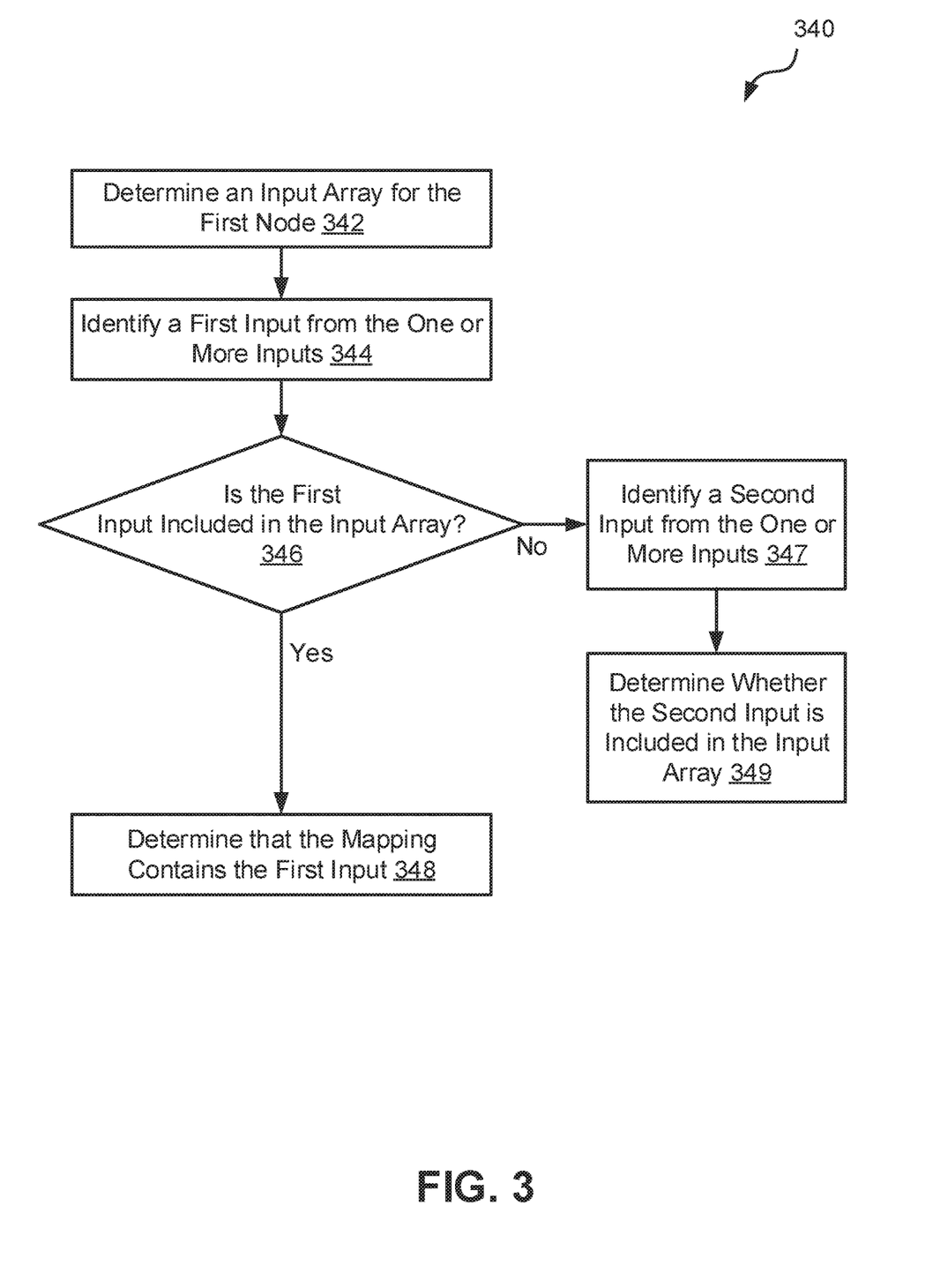
FIG. 3 depicts a flowchart of a set of operations for determining whether mapping contains an input from an input node, according to some embodiments.

Determining whether the mapping contains an input from an input node (operation 140) is discussed further herein, and is further depicted in FIG. 3.

In some embodiments, if the mapping does contain an input from an input node, method 100 proceeds to operation 150 to identify valid drop points for the first node using the input node. Valid drop points may be drop locations (i.e., locations on the integration flow that the first node can be moved to) that, if the first node is moved to those drop locations, will not affect the execution of the first node. Simply put, the valid drop points may be locations the first node can be moved to while still maintaining the validity of any current mappings on the first node.

In some embodiments, determining the valid drop points may include invalidating all drop points that are prior to the input node. Dropping the first node at a drop point that is prior to (i.e., preceding) the input node may affect the validity of current mappings on the first node because the first node would be moved to a location preceding the input node. Having an input node located subsequent to the first node may prevent the first node from obtaining accurate inputs, thus resulting in invalid mappings. By invalidating all drop points prior to the input node, the first node may only be moved (e.g., dropped) to drop points that are subsequent to the input node, therefore maintaining the validity of the current mappings on the first node.

In some embodiments, the input node is the nearest input node, as discussed herein. In these embodiments, determining the valid drop points may include invalidating all drop points that are prior to the nearest input node. If a node prior to the nearest input node (referred to herein as a prior input node) is an input for the first node, dropping (e.g., from a drag and drop mechanism) the first node at a drop point that is prior to the nearest input node (i.e., either between the nearest input node and the prior input node or preceding the prior input node) would result in the first node preceding at least one of its input nodes, thus affecting the validity of the first node and its mappings.

Additionally, if a prior input node is an input for the nearest input node, moving (e.g., dropping) the first node to a drop point prior to the nearest input node may affect the validity of both the nearest input node and the first node. As discussed herein, having the input node located subsequent to the first node may affect the validity of the mappings of the first node. In addition, the first node may disrupt the inputs of the nearest input node, depending on the location of the input nodes for the nearest input node. Disrupting the inputs of the nearest input node may invalidate the mappings of the nearest input node, which would, in turn, invalidate the mappings of the first node, as the nearest input node corresponds to an input of the first node. Therefore, invalidating all drop points prior to the nearest input node may ensure that the validity of the mappings of the first node are maintained.

Figure 4:
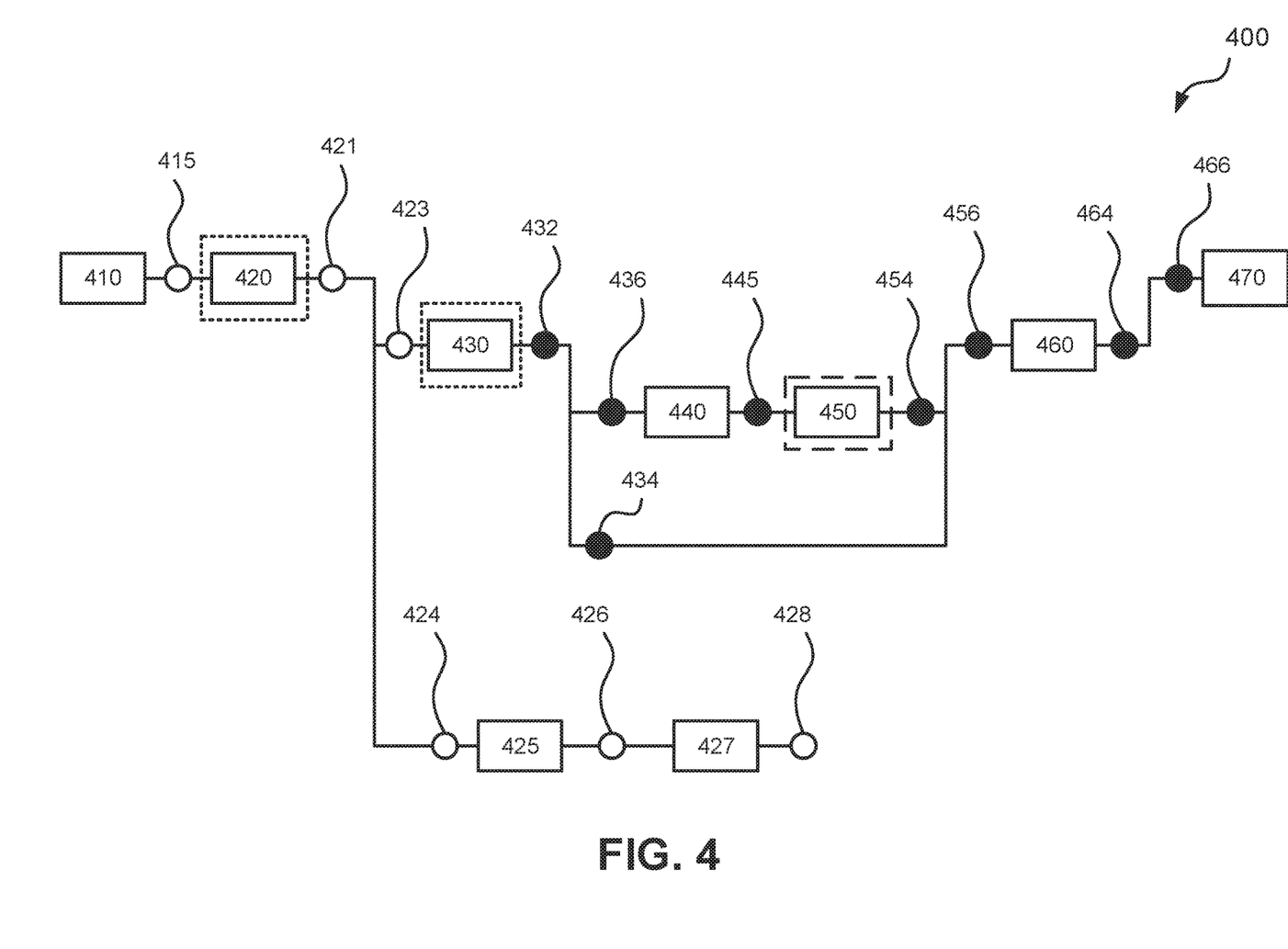
FIG. 4 depicts a schematic diagram of a first example integration flow with valid drop points, according to some embodiments.
Figure 5:
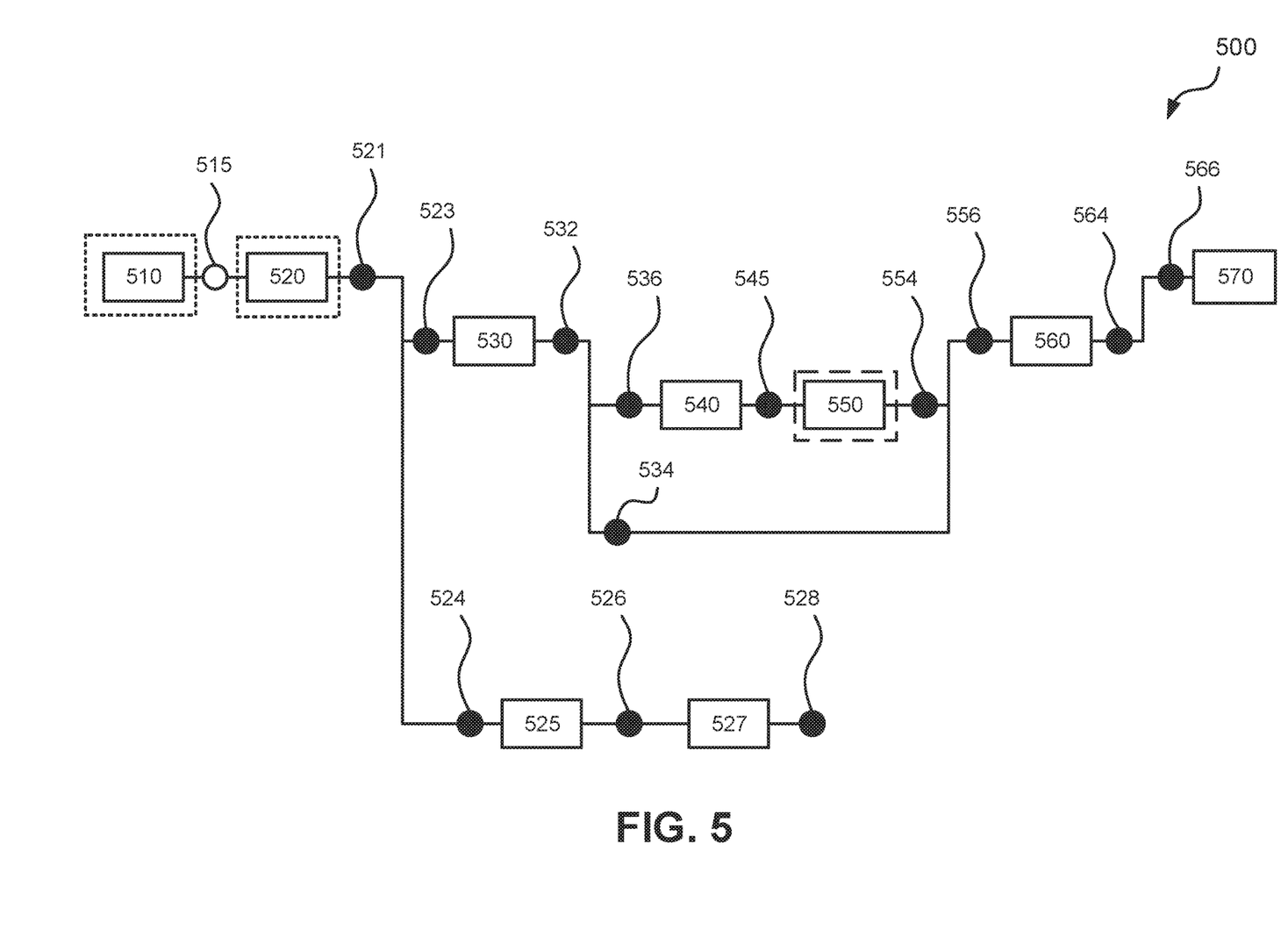
FIG. 5 depicts a schematic diagram of a second example integration flow with valid drop points, according to some embodiments.

In some embodiments, method 100 includes executing operation 160 to output a visual representation of the valid drop points. Once it is determined which drop points are valid and will not affect the validity of the mappings of the first node, these valid drop points may need to be communicated to a user, such as through a visual representation. For example, as depicted in FIG. 4 and FIG. 5, the visual representation of valid drop points may be filling in the valid drop point locations. In another example, the valid drop points may be a specific color (e.g., green), and the other drop points may be a different color (e.g., red) or no color at all. In another example, the valid drop points may have an outline (e.g., a rectangle, circle, etc.) indicating their validity. Continuing the previous example, the outline may be a specific color (e.g., green) further emphasizing the validity of the drop points. The visual representation of the valid drop points may be any visual indication that helps indicate which drop points are valid (e.g., which drop points are available for a user to drag and drop the first node to).

Looking back to operation 140, if it is determined that the mapping does not contain an input from an input node, method 100 may proceed to operation 145 to identify all available drop points as valid drop points. If the mapping does not contain any inputs from the input nodes, then there may not be a concern of moving the first node to a drop point preceding its input and corresponding input node, because there are no drop points that precede, or are prior to, the input node. Therefore, all available drop points (e.g., drop points that have not been invalidated for other reasons) may be identified as valid drop points, as all the available drop points may not affect the validity of the mappings of the first node.

Figure 2:
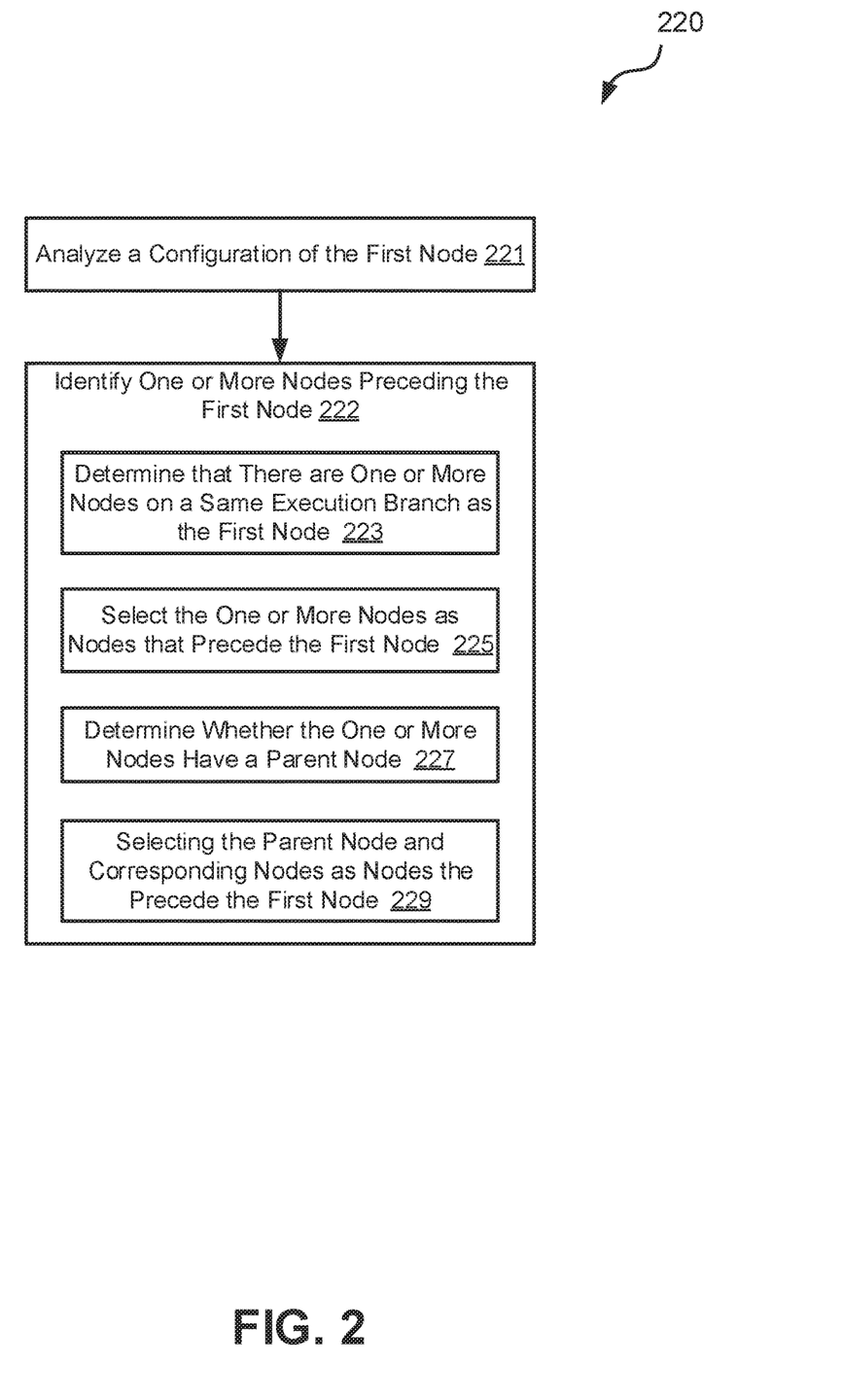
FIG. 2 depicts a flowchart of a set of operations for identifying input nodes, according to some embodiments.

Referring to FIG. 2, a flowchart illustrating a method 220 for identifying input nodes is depicted, according to some embodiments. In some embodiments, method 220 is a subset of operation 120 from method 100 (FIG. 1). In some embodiments, the method 220 is implemented as a computer script or computer program (e.g., computer executable code) to be executed by a server on or connected to a computer system (e.g., computer system 600 (FIG. 6)). In some embodiments, the server is a computer device, such as computer system/server 602 (FIG. 6). In some embodiments, the method 220 is executed on a cloud computing environment (e.g., cloud computing environment 50 (FIG. 7)).

In some embodiments, identifying one or more input nodes (method 220) includes executing operation 221 to analyze a configuration of the first node. The configuration may include at least a structure of integration flow of the first node. As discussed herein, the first node is a component of an integration flow. The integration flow may include a plurality of nodes. The configuration of the first node may be the arrangement, or layout, of the integration flow that the first node is a part of. In some embodiments, analyzing the configuration of the first node includes determining the location of the first node in the integration flow, and identifying the other nodes (i.e., components) of the integration flow.

In some embodiments, method 220 includes executing operation 222 to identify one or more nodes preceding the first node. In some embodiments, there are one or more nodes that precede the first node (i.e., are upstream from the first node) within the integration flow. The nodes that precede the first node may have the potential to correspond to inputs of the mapping of the first node. Simply put, the outputs of the nodes preceding the first node may have the possibility of being used as inputs of the first node (specifically the mapping of the first node).

In some embodiments, identifying one or more nodes preceding the first node (operation 222) includes determining that there are one or more nodes on a same execution branch as the first node (operation 223) and selecting the one or more nodes as nodes that precede the first node (operation 225). The integration flow may include one or more execution branches within the flow. For example, a node may include an if/then statement, which may result in two different branches reflecting the "if/then" path and the alternative path, respectively. The node that results in the branch in the integration flow (e.g., node 420 and/or node 430 (FIG. 4)) may be referred to herein as a parent node. In some embodiments, the first node is on an execution branch within the integration flow. In some embodiments, the execution branch also includes one or more other nodes. The nodes that are on the same execution branch as the first node that also precede (e.g., upstream from, to the left of, etc.) the first node may be selected as nodes that precede the first node.

In some embodiments, identifying one or more nodes preceding the first node (operation 222) further includes determining whether the one or more nodes have a parent node (operation 227) and selecting the parent node and corresponding nodes as nodes that precede the first node (operation 229). As discussed herein, a parent node may be the node preceding, or resulting in, the execution branches (e.g., node 420, node 430 (FIG. 4), node 520, and node 530 (FIG. 5)). In some embodiments, the first node, and the other nodes on the same execution branch, have a parent node. If the first node and the other one or more nodes on the same execution branch have a parent node, then the parent node may be selected as a node that precedes the first node. Additionally, if there are other nodes (referred to herein as corresponding nodes) that are on the same execution branch as the parent node (referred to herein as a parent execution branch), then the corresponding nodes may also be selected as nodes that precede the first node.

In some embodiments, identifying one or more nodes preceding the first node (operation 222) further includes determining that the first parent node has a second parent node. In some embodiments, the parent node (i.e., first parent node) and its corresponding nodes may have a second parent node (e.g., nodes 430 is a first parent node and node 420 is a second parent node, or a parent node of node 430

(FIG. 4)). Simply put, the parent execution branch with the first parent node may branch off from a second parent node. If the first parent node, and the first corresponding nodes, have a second parent node, the second parent nodes may also be selected as a node that precedes the first node. Additionally, if there are any corresponding nodes (i.e., second corresponding nodes) on the same parent execution branch as the second parent node, the second corresponding nodes may also be selected as nodes that precede the first node.

In some embodiments, the process of determining if a parent node has another parent node, and selecting the other parent node and its corresponding nodes as nodes that precede the first node, is repeated until there are no additional parent nodes, indicating that the beginning of the integration flow has been reached. By repeating this process until reaching the beginning of the integration flow, all the levels of hierarchy (i.e., branches) of the integration flow with nodes that have a possibility of being inputs for the first node may be discovered/identified. This may help increase the accuracy of determining the valid drop points, as all the possible input nodes may be discovered.

Referring to FIG. 3, a flowchart illustrating a method 340 for determining whether mapping contains an input from an input node is depicted, according to some embodiments. In some embodiments, method 340 is a subset of operation 140 from method 100 (FIG. 1). In some embodiments, the method 340 is implemented as a computer script or computer program (e.g., computer executable code) to be executed by a server on or connected to a computer system (e.g., computer system 600 (FIG. 6)). In some embodiments, the server is a computer device, such as computer system/server 602 (FIG. 6). In some embodiments, the method 340 is executed on a cloud computing environment (e.g., cloud computing environment 50 (FIG. 7)).

In some embodiments, determining whether the mapping contains an input from an input node (method 340) includes executing operation 342 to determine an input array for the first node. As discussed herein, each node may have generated mappings for that node. A mapping may define how to calculate values that are used to interact with external systems. Each mapping may have an input array that has been defined, which contains the minimal inputs required for the map. For example, an integration flow includes nodes A, B, and C. In this example, node C only maps from node B (i.e., the mapping for node C only uses an input from node B). In this example, only node B is included in node C's input array, because node A is not required for node C's map. In some embodiments, determining an input array for the first node includes analyzing the mapping for the first node to identify the input array. The input array for the first node may include all the required inputs for the mapping of the first node. As discussed herein, it may be possible for any of the nodes that precede the first node to be inputs for the first node. The input array may identify, or specify, which nodes were actually used as inputs for the first node.

In some embodiments, method 340 includes executing operation 344 to identify a first input from the one or more inputs. As discussed herein, and depicted in FIG. 1, the mapping (for the first node) may contain one or more inputs from the one or more input nodes. Each input node may correspond to one or more inputs, and these one or more inputs may have the possibility of being used as inputs for the mapping of the first node. From the one or more inputs, one input may be identified, or selected. In some embodiments, the first input may be an input from the nearest input node (i.e., an input node that is closest to the first node). In some embodiments, the first input may be an input from a beginning input node (i.e., an input node at the beginning of the integration flow). In some embodiments, the first input may be an input from a randomly selected input node.

Once an input has been identified, method 340 may proceed to operation 346 to determine whether the first input is included in the input array. In some embodiments, the input array includes the inputs that are required for the mapping of the first node. Determining whether the first input is included in the input array may determine whether or not the first input is a required input in order to maintain the validity of the mapping for the first node. For example, the first input, which is from one of the input nodes, may be compared to the input array, to see if the input array includes the first input.

In some embodiments, if the first input is included in the input array, method 340 proceeds to operation 348 to determine that the mapping contains the first input. If the input array includes the first input, then the first input may be a required input, and may be necessary to maintain the validity of the mapping of the first node. Because the first input may be a required input, the mapping of the first node may actually use the first input, so any disruption to the first input may result in errors, or issues, with the mapping.

In some embodiments, once it is determined that the mapping contains the first input, method 340, starting with operation 342, may be repeated for the other input values for each of the one or more input nodes. Repeating method 340 for all the other possible inputs may determine all the inputs that are required for the mapping of the first node.

Looking back to operation 346, if the first input is not included in the input array, method 340 proceeds to operation 347 to identify a second input from the one or more inputs. If the first input is not included in the input array, then the first input may not be a required input, and may not be necessary to maintain the validity of the mapping of the first node. Once it is determined that the first input is not included in the input array, the other inputs for the one or more input nodes may be checked to see if any of the other inputs are included in the input array. This may include identifying a second input from the one or more inputs (operation 347). In some embodiments, the second input may be the next consecutive input after the first input. For example, an input node may have multiple inputs, and the first input may be the first consecutive input on the input node, and the second input may be the next consecutive input on the input node. In another example, the first input may be from an input node closest to the first node (i.e., nearest input node), but the nearest input node may only correspond to one input. In this example, the second input node may be an input from the second closest input node to the first node. In another example, the first input may be from an input node at the beginning of the integration flow. In this example, the second input may be from an input node that is the second node from the beginning of the integration flow.

Once a second input has been identified, method 340 may proceed to operation 349 to determine whether the second input is included in the input array. As discussed herein, the input array may include the inputs that are required for the mapping of the first node. Determining whether the second input is included in the input array may determine whether or not the second input is a required input in order to maintain the validity of the mapping for the first node. If the second input is included in the input array, then it may be determined that the mapping contains the second input.

In some embodiments, once it is determined whether the mapping contains the second input, method 340, starting with operation 342, may be repeated for the other input values for each of the one or more input nodes. Repeating method 340 for all the other possible inputs may determine all the inputs that are required for the mapping of the first node.

Referring to FIG. 4, a schematic diagram illustrating a first example integration flow 400 is depicted, according to some embodiments. Integration flow 400 includes nodes 410, 420, 425, 427, 430, 440, 450, 460, and 470. Integration flow 400 also includes potential drop points 415, 421, 423, 424, 426, 428, 432, 434, 436, 445, 454, 456, 464, and 466. As illustrated, node 450 may be the node that has been selected for moving (e.g., the first node), as indicated by the dotted line. In some embodiments, node 450 may have been selected by a user using a drag and drop operation. In the illustrated example, node 440 is characterized as an input node because it is on the same execution branch as node 450. Additionally, in the illustrated example, node 430 may be characterized as a parent node for both nodes 440 and 450, because node 430 results in the execution branches (one of which houses nodes 440 and 450). Because node 430 may be a parent node of nodes 440 and 450, node 430 may also be characterized as an input node. Further, in the illustrated example, node 420 may be characterized as a parent node of node 430, so node 420 and its corresponding node 410 (i.e., a node on the same execution branch as the parent node) may also be characterized as input nodes. In the illustrated example, from all the input nodes (nodes 410, 420, 430, and 440), it has been determined that the mapping for node 450 contains inputs from input nodes 420 and 430, as indicated by the smaller dotted lines. In some embodiments, method 340 (FIG. 3) may have been used to make this determination.

In the illustrated example, node 430 may be the input node, with an input that is contained in the mapping, that is closest to node 450, so all drop points prior to node 430 (drop points 428, 426, 424, 423, 421, and 415) may be marked as invalid. Drop points 432, 434, 436, 445, 454, 456, 464, and 466 may all be valid drop points, because they may be available drop points that are subsequent to node 430.

Referring to FIG. 5, a schematic diagram illustrating a second example integration flow 500 is depicted, according to some embodiments. Integration flow 500 includes nodes 510, 520, 525, 527, 530, 540, 550, 560, and 570. Integration flow 500 also includes potential drop points 515, 521, 523, 524, 526, 528, 532, 534, 536, 545, 554, 556, 564, and 566. As illustrated, node 550 may be the node that has been selected for moving (e.g., the first node), as indicated by the dotted line. In some embodiments, node 550 may have been selected by a user using a drag and drop operation. In the illustrated example, node 540 is characterized as an input node because it is on the same execution branch as node 550. Additionally, in the illustrated example, node 530 may be characterized as a parent node for both nodes 540 and 550, because node 530 results in the execution branches (one of which houses nodes 540 and 550). Because node 530 may be a parent node of nodes 540 and 550, node 530 may also be characterized as an input node. Further, in the illustrated example, node 520 may be characterized as a parent node of node 530, so node 520 and its corresponding node 510 (i.e., a node on the same execution branch as the parent node) may also be characterized as input nodes. In the illustrated example, from all the input nodes (nodes 510, 520, 530, and 540), it has been determined that the mapping for node 550 contains inputs from input nodes 510 and 520, as indicated by the smaller dotted lines. In some embodiments, method 340 (FIG. 3) may have been used to make this determination.

In the illustrated example, node 520 may be the input node, with an input that is contained in the mapping, that is closest to node 550, so all drop points prior to node 520 (drop point 515) may be marked as invalid. Drop points 521, 523, 524, 526, 528, 532, 534, 536, 545, 554, 556, 564, and 566 may all be valid drop points, because they may all be available drop points that are subsequent to node 520.

Referring to FIG. 6, computer system 600 is a computer system/server 602 is shown in the form of a general-purpose computing device, according to some embodiments. In some embodiments, computer system/server 602 is located on the linking device. In some embodiments, computer system 602 is connected to the linking device. The components of computer system/server 602 may include, but are not limited to, one or more processors or processing units 610, a system memory 660, and a bus 615 that couples various system components including system memory 660 to processor 610.

Bus 615 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 602 typically includes a variety of computer system readable media. Such media may be any available media that is accessible by computer system/server 602, and it includes both volatile and non-volatile media, removable and non-removable media.

System memory 660 can include computer system readable media in the form of volatile memory, such as random-access memory (RAM) 662 and/or cache memory 664. Computer system/server 602 may further include other removable/non-removable, volatile/non-volatile computer system storage media. By way of example only, storage system 665 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 615 by one or more data media interfaces. As will be further depicted and described below, memory 660 may include at least one program product having a set (e.g., at least one) of program modules that are configured to carry out the functions of embodiments of the disclosure.

Program/utility 668, having a set (at least one) of program modules 669, may be stored in memory 660 by way of example, and not limitation, as well as an operating system, one or more application programs, other program modules, and program data. Each of the operating system, one or more application programs, other program modules, and program data or some combination thereof, may include an implementation of a networking environment. Program modules 669 generally carry out the functions and/or methodologies of embodiments of the invention as described herein.

Computer system/server 602 may also communicate with one or more external devices 640 such as a keyboard, a pointing device, a display 630, etc.; one or more devices that enable a user to interact with computer system/server 602; and/or any devices (e.g., network card, modem, etc.) that enable computer system/server 602 to communicate with one or more other computing devices. Such communication can occur via Input/Output (I/O) interfaces 620. Still yet, computer system/server 602 can communicate with one or more networks such as a local area network (LAN), a general wide area network (WAN), and/or a public network (e.g., the Internet) via network adapter 650. As depicted, network adapter 650 communicates with the other components of computer system/server 602 via bus 615. It should be understood that although not shown, other hardware and/or software components could be used in conjunction with computer system/server 602. Examples include, but are not limited to: microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
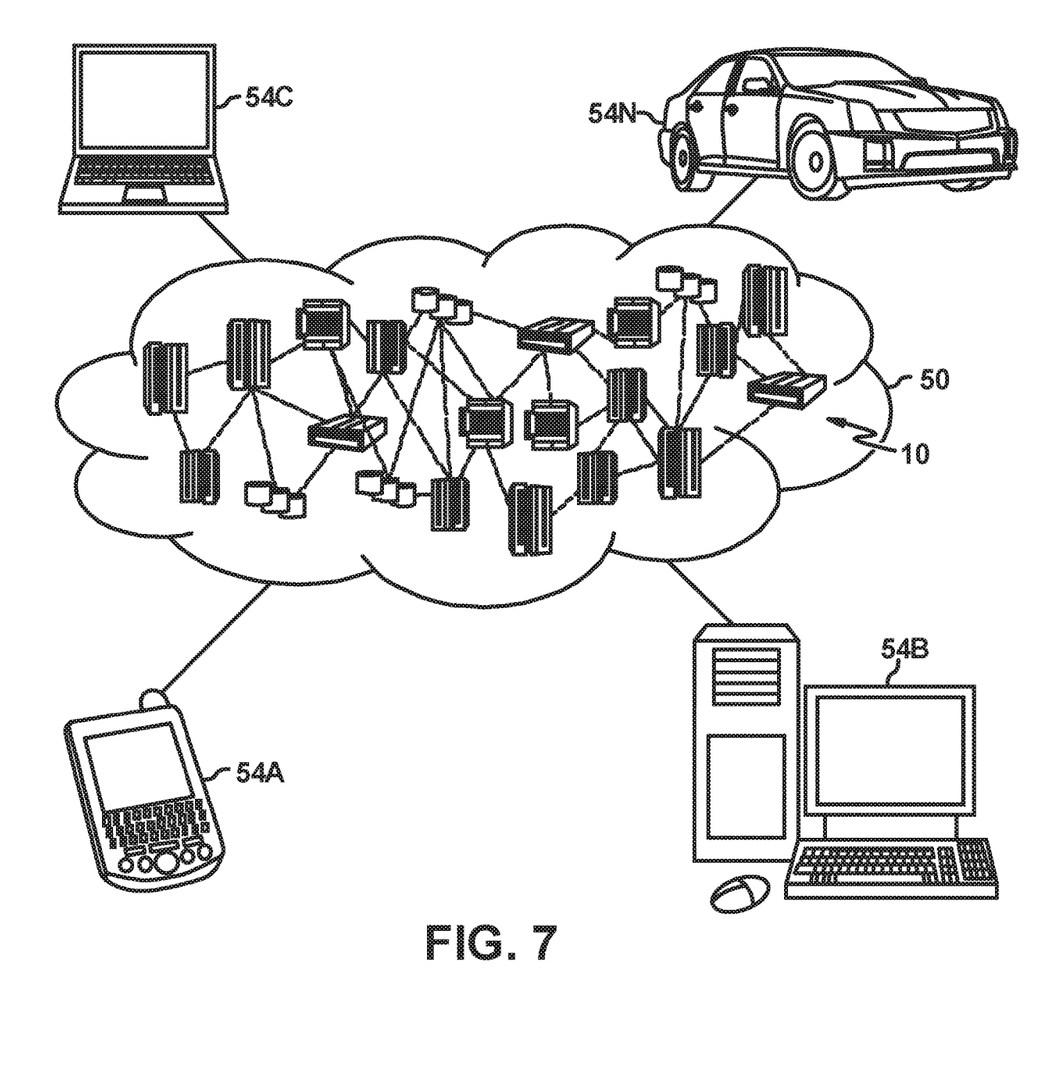
FIG. 7 depicts a cloud computing environment, according to some embodiments.

Referring now to FIG. 7, illustrative cloud computing environment 50 is depicted, according to some embodiments. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Figure 8:
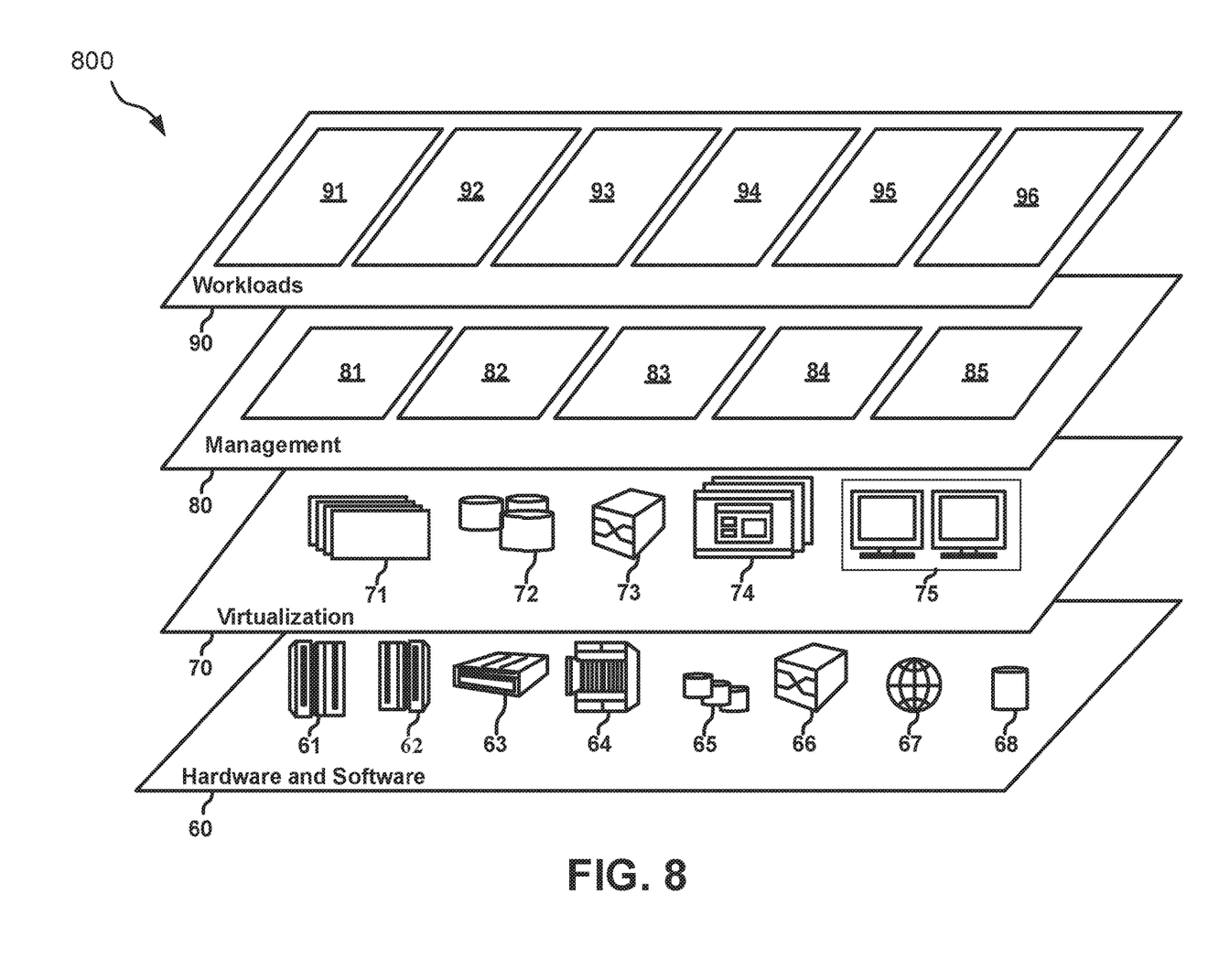
FIG. 8 depicts abstraction model layers, according to some embodiments.

Referring now to FIG. 8, a set of functional abstraction layers 800 provided by cloud computing environment 50 (FIG. 7) is shown, according to some embodiments. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and node analyzing 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electronic signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object orientated program language such as Smalltalk, C++, or the like, and procedural programming languages, such as the "C" programming language or similar programming languages. The computer readable program instructions may execute entirely one the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   identifying a first node;
   identifying one or more input nodes, wherein the one or more input nodes are nodes within an integration flow of the first node;
   analyzing a mapping of the first node, wherein the analyzing comprises:
   determining whether the mapping contains one or more inputs from the one or more input nodes; and
   in response to determining that the mapping contains one or more inputs from an input node of the one or more input nodes, identifying valid drop points for the first node using the input node, wherein the valid drop points are located subsequent to the input node, and wherein identifying valid drop points comprises: invalidating all drop points that are prior to the input node.

2. The method of claim 1, wherein identifying the one or more input nodes comprises: analyzing a configuration of the first node, wherein the configuration includes at least a structure of the integration flow of the first node; and identifying one or more nodes preceding the first node within the integration flow of the first node.

3. The method of claim 2, wherein identifying the one or more nodes preceding the first node comprises: determining that there is a first one or more nodes on a same first execution branch as the first node; selecting the first one or more nodes as nodes that precede the first node; determining whether the first one or more nodes have a first parent node; and in response to determining that the first one or more nodes have a first parent node, selecting the first parent node and any first corresponding nodes as nodes that precede the first node, wherein the first corresponding nodes are one or more nodes on a same parent execution branch as the first parent node.

4. The method of claim 3, further comprising: determining that the first parent node has a second parent node; and selecting the second parent node and any second corresponding nodes as nodes that precede the first node, wherein the second corresponding nodes are on a same second parent execution branch as the second parent node.

5. The method of claim 1, wherein determining whether the mapping contains one or more inputs from the one or more input nodes comprises: determining an input array for the first node from the mapping; identifying a first input from the one or more inputs; and determining whether the first input is included in the input array.

6. The method of claim 5, wherein the first input corresponds with an input node of the one or more input nodes that is a first preceding node of the first node.

7. The method of claim 6, further comprising: in response to determining that the first input is not included in the input array, identifying a second input from the one or more inputs; and determining whether the second input is included in the input array, wherein the second input corresponds with an input node of the one or more input nodes that is a second preceding node of the first node.

8. The method of claim 1, wherein the input node is a nearest input node.

9. The method of claim 1, further comprising: outputting a visual representation of the valid drop points.

10. The method of claim 1, wherein the first node has been selected for a drag and drop operation.

11. A system having one or more computer processors, the system configured to:
    identify a first node;
    identify one or more input nodes, wherein the one or more input nodes are nodes within an integration flow of the first node;
    analyze a mapping of the first node, wherein the analyzing comprises:
    determine whether the mapping contains one or more inputs from the one or more input nodes; and in response to determining that the mapping contains one or more input from an input node of the one or more input nodes, identify valid drop points for the first node using the input node, wherein the valid drop points are located subsequent to the input node, and wherein identifying valid drop points comprises: invalidating all drop points that are prior to the input node.

12. The system of claim 11, wherein identifying the one or more input nodes comprises: analyzing a configuration of the first node, wherein the configuration includes at least a structure of the integration flow of the first node; and identifying one or more nodes preceding the first node within the integration flow of the first node.

13. The system of claim 12, wherein identifying the one or more nodes preceding the first node comprises: determining that there is a first one or more nodes on a same first execution branch as the first node; selecting the first one or more nodes as nodes that precede the first node; determining whether the first one or more nodes have a first parent node; and in response to determining that the first one or more nodes have a first parent node, selecting the first parent node and any first corresponding nodes as nodes that precede the first node, wherein the first corresponding nodes are one or more nodes on a same parent execution branch as the first parent node.

14. The system of claim 13, further comprising: determining that the first parent node has a second parent node; and selecting the second parent node and any second corresponding nodes as nodes that precede the first node, wherein the second corresponding nodes are on a same second parent execution branch as the second parent node.

15. The system of claim 11, wherein determining whether the mapping contains one or more inputs from the one or more input nodes comprises: determining an input array for the first node from the mapping; identifying a first input from the one or more inputs; and determining whether the first input is included in the input array.

16. A computer program product comprising a computer readable storage medium having program instructions embodied therewith, the program instructions executable by a server to cause the server to perform a method, the method comprising:

identifying a first node;
identifying one or more input nodes, wherein the one or more input nodes are nodes within an integration flow of the first node;
analyzing a mapping of the first node, wherein the analyzing comprises:
determining whether the mapping contains one or more inputs from the one or more input nodes; and
in response to determining that the mapping contains one or more inputs from an input node of the one or more input nodes, identifying valid drop points for the first node using the input node, wherein the valid drop points are located subsequent to the input node, and wherein identifying valid drop points comprises: invalidating all drop points that are prior to the input node.

17. The computer program product of claim 16, wherein identifying the one or more input nodes comprises: analyzing a configuration of the first node, wherein the configuration includes at least a structure of the integration flow of the first node; and identifying one or more nodes preceding the first node within the integration flow of the first node.

18. The computer program product of claim 16, wherein determining whether the mapping contains one or more inputs from the one or more input nodes comprises: determining an input array for the first node from the mapping; identifying a first input from the one or more inputs; and determining whether the first input is included in the input array.

19. The computer program product of claim 16, wherein identifying valid drop points comprises: invalidating all drop points that are prior to the input node.

* * * * *